US008384144B2

(12) United States Patent
Anthony

(10) Patent No.: US 8,384,144 B2
(45) Date of Patent: Feb. 26, 2013

(54) METAL-INSULATOR-METAL CAPACITORS

(75) Inventor: Michael P. Anthony, Andover, MA (US)

(73) Assignee: Kenet, Inc., Woburn, WA (US)

( * ) Notice: Subject to any disclaimer, the term of this patent is extended or adjusted under 35 U.S.C. 154(b) by 400 days.

(21) Appl. No.: 12/287,045

(22) Filed: Oct. 6, 2008

(65) Prior Publication Data

US 2009/0109597 A1    Apr. 30, 2009

Related U.S. Application Data

(63) Continuation of application No. 11/809,800, filed on Jun. 1, 2007, now Pat. No. 7,439,570.

(60) Provisional application No. 60/810,257, filed on Jun. 2, 2006.

(51) Int. Cl.
*H01L 29/76* (2006.01)

(52) U.S. Cl. .......................... 257/307; 257/309

(58) Field of Classification Search .................. 257/307, 257/309
See application file for complete search history.

(56) References Cited

U.S. PATENT DOCUMENTS

| | | | |
|---|---|---|---|
| 5,459,633 A | 10/1995 | Kosslowski et al. | |
| 6,066,537 A | 5/2000 | Poh | |
| 6,265,764 B1 | 7/2001 | Kinsman | |
| 6,266,226 B1 | 7/2001 | Hayashi | |
| 6,385,033 B1 * | 5/2002 | Javanifard et al. ......... | 361/306.2 |
| 6,480,052 B1 | 11/2002 | Pettersen | |
| 6,563,191 B1 | 5/2003 | Casey et al. | |
| 6,737,698 B1 | 5/2004 | Paul et al. | |
| 6,897,509 B2 | 5/2005 | Yamauchi et al. | |
| 6,927,125 B2 | 8/2005 | Jones et al. | |
| 7,022,581 B2 | 4/2006 | Harris | |
| 7,176,506 B2 | 2/2007 | Beroz et al. | |
| 7,561,407 B1 * | 7/2009 | Chen et al. ................. | 361/306.1 |
| 7,768,044 B2 * | 8/2010 | He et al. ....................... | 257/288 |
| 7,768,098 B2 | 8/2010 | Apel | |
| 2005/0145987 A1 | 7/2005 | Okuda et al. | |
| 2006/0061935 A1 | 3/2006 | Schultz et al. | |
| 2006/0197133 A1 | 9/2006 | Jung et al. | |

FOREIGN PATENT DOCUMENTS

| | | |
|---|---|---|
| JP | 2001 267503 | 9/2001 |
| JP | 2005108874 | 4/2005 |
| WO | WO 96/27907 | 9/1996 |

OTHER PUBLICATIONS

Gregorian et al. *Analog MOS Integrated Circuits for Signal Processing*, John Wiley & Sons, New York New York, 1986, Section 7.5, pp. 513-529.

* cited by examiner

*Primary Examiner* — Eugene Lee
(74) *Attorney, Agent, or Firm* — Cesari and McKenna, LLP

(57) ABSTRACT

An interdigitated Metal-Insulator-Metal (MIM) capacitor provides self-shielding and accurate capacitance ratios with small capacitance values. The MIM capacitor includes two terminals that extend to a plurality of interdigitated fingers separated by an insulator. Metal plates occupy layers above and below the fingers and connect to fingers of one terminal. As a result, the MIM capacitor provides self-shielding to one terminal. Additional shielding may be employed by a series of additional shielding layers that are isolated from the capacitor. The self-shielding and additional shielding may also be implemented at an array of MIM capacitors.

14 Claims, 14 Drawing Sheets

METAL-INSULATOR-METAL CAPACITORS

RELATED APPLICATION

This application is a continuation of U.S. application Ser. No. 11/809,800, filed Jun. 1, 2007, now U.S. Pat. No. 7,439,570 which claims the benefit of U.S. Provisional Patent Application No. 60/810,257, filed Jun. 2, 2006, the entire teachings of which are incorporated herein by reference.

BACKGROUND OF THE INVENTION

Metal-insulator-metal (MIM) capacitors are widely used in hybrid and monolithic electronic circuits. Such capacitors can be vertical, with horizontal metal plates; lateral, with vertical plates; or mixed, employing capacitance between both vertically-separated and horizontally-separated plates. In some applications, special insulator layers are provided for optimized capacitor performance. In others, existing dielectrics are used, such as the inter-metal dielectrics which separate metal interconnections. The capacitors discussed below employ inter-metal dielectrics of this type, and are of mixed orientation.

Interdigitated MIM capacitor structures similar to the capacitor 100 depicted in FIG. 1A have been used extensively in both semiconductor and hybrid processes. They provide reasonably well-controlled capacitance, with acceptable parasitic elements (resistance, inductance) for many applications, while employing only process elements already present for other reasons: metal for interconnects and dielectrics for substrate and/or insulation. Capacitors of this type are often described as being composed of a number of 'fingers.' In the capacitor 100 illustrated in FIG. 1A, capacitor terminal 1 is connected to four fingers, and capacitor terminal 2 is connected to three fingers. A cross-section of the capacitor of FIG. 1A along line A-A' is shown in FIG. 1B, with fingers connected to each of the two terminals identified as 1 and 2 respectively. Capacitance between terminals 1 and 2 in this structure is primarily horizontal, with fringing-field components extending into the vertical dimension.

Terminal 2 of the capacitor 100 has capacitance to terminal 1 along both sides of each of its three fingers, along the length labeled 'L.' In addition, finger-ends such as 3, 4, and 5 contribute some capacitance. If this capacitor design is generalized to more or fewer fingers, while maintaining one more finger for terminal 1 than for terminal 2, we can write for the total capacitance between terminals 1 and 2:

$$C = N_F L C_0 + N_F C_3 + 2C_4 + (N_F - 1)C_5 \qquad \text{(Equation 1)}$$

where $N_F$ is the number of terminal-2 fingers; $C_0$ is the capacitance per unit length per finger; $C_3$ is the capacitance per terminal-2 finger-end like 3; $C_4$ is the capacitance per outside corner like 4; and $C_5$ is the capacitance per terminal-1 finger-end like 5. In the example illustrated in FIG. 1, $N_F = 3$.

The first term in Equation 1 ($N_F L C_0$) is proportional to both the number of fingers $N_F$ and the length L, both of which are convenient design parameters. The remaining terms embody the finger-end effects enumerated, and are less subject to control of the designer, but rather depend more on process details. Equation 1 can be simplified by re-combining the second through fourth terms:

$$C = _{N_F L C_0} + N_F C_1 + C_2 \qquad \text{(Equation 2)}$$

where $C_0$ is again the capacitance per finger per unit length; $C_1$ is a capacitance per finger, independent of finger length; and $C_2$ is a fixed 'offset' capacitance, independent of both $N_F$ and L. ($C_2$ may be either positive or negative.)

SUMMARY OF THE INVENTION

A. Recognition of Problems with the Prior Art

One desirable property of capacitors in circuit design is matching between nominally-identical capacitors. If capacitors with well-matched values can be reliably fabricated, then many circuits which depend on capacitance ratios can be constructed using arrays of 'unit' matched capacitors. Capacitors like that in FIG. 1A are suited to this type of matching, in that both the capacitance-per-unit-length $C_0$ and the end-effects are generally quite repeatable within a given process batch. If the length L is much greater than the finger spacing, then the first term in Equation 2 dominates total capacitance, making C reasonably stable batch-to-batch as well.

In many applications it is desirable to maximize the capacitance per unit area provided by MIM capacitors. In processes with more than one metal layer, the additional layers can be used to provide additional capacitance in various ways, generally involving interdigitated structures like that of FIG. 1A, stacked one over another. Such multi-layer MIM capacitors can retain many of the matching properties just discussed.

B. Summary of Preferred Embodiments of Invention

The present invention relates to an interdigitated Metal-Insulator-Metal capacitor. In some embodiments, the interdigitated capacitor comprises an odd number greater than two of parallel metal fingers formed in a single metal layer and separated by a dielectric. The odd-numbered fingers may be connected to a first electrical terminal of the capacitor, and the even-numbered fingers may be connected to a second electrical terminal of the capacitor. Continuous metal plates extend at least as far as the outermost fingers, occupying metal layers above and below the layer containing the fingers, and separated from the fingers by layers of dielectric, with the plates connected to the outermost fingers. As a result, the first terminal shields the second terminal at all sides, thereby providing self-shielding to the capacitor.

In further embodiments, additional shielding may be provided by layers above and below the capacitor. The shielding layers may be electrically isolated from the terminals and connected by a series of metal layers and vias encompassing the capacitor. The capacitor terminals may be configured in a number of ways to provide predictable capacitances.

In still further embodiments, an array of capacitors may include a plurality of self-shielded MIM capacitors sharing a common terminal.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of preferred embodiments of the invention follows.

It is increasingly desirable to minimize the power consumption of electronic circuits. One means of reducing power consumption is to reduce the size of capacitors used in the circuits, thus representing signals with smaller charge quantities. In this case it is desirable to produce capacitors with very small values, while retaining good matching and well-controlled ratios. While the unit-capacitor matching method discussed above is well-suited to large capacitor values, it is less effective when the desired unit capacitor requires a small number of fingers and L approaching the process's minimum dimensions. In this case the end effects become more significant, resulting in poor matching, less-predictable capacitance, and greater overall capacitance variation batch-to-batch. MIM capacitor designs which provide very small capacitance values with good matching, well-controlled ratios, and small batch-to-batch variability would therefore be desirable.

In many circuit designs it is desirable to minimize the so-called "parasitic" capacitance between capacitor terminals and other circuit nodes. Parasitic capacitance to circuit common ("ground") can cause increased circuit noise and reduced circuit speed. Parasitic capacitance to other circuit nodes can give rise to errors due to noise and un-intended signal coupling. It would therefore be desirable to provide a MIM capacitor design with minimized capacitance to ground and with shielding from other circuit nodes.

Embodiments of the present invention provide MIM capacitors with each of the desirable properties just enumerated. The first feature of this invention provides near-elimination of parasitic capacitance and near-perfect shielding at one capacitor terminal.

Figure 2A:
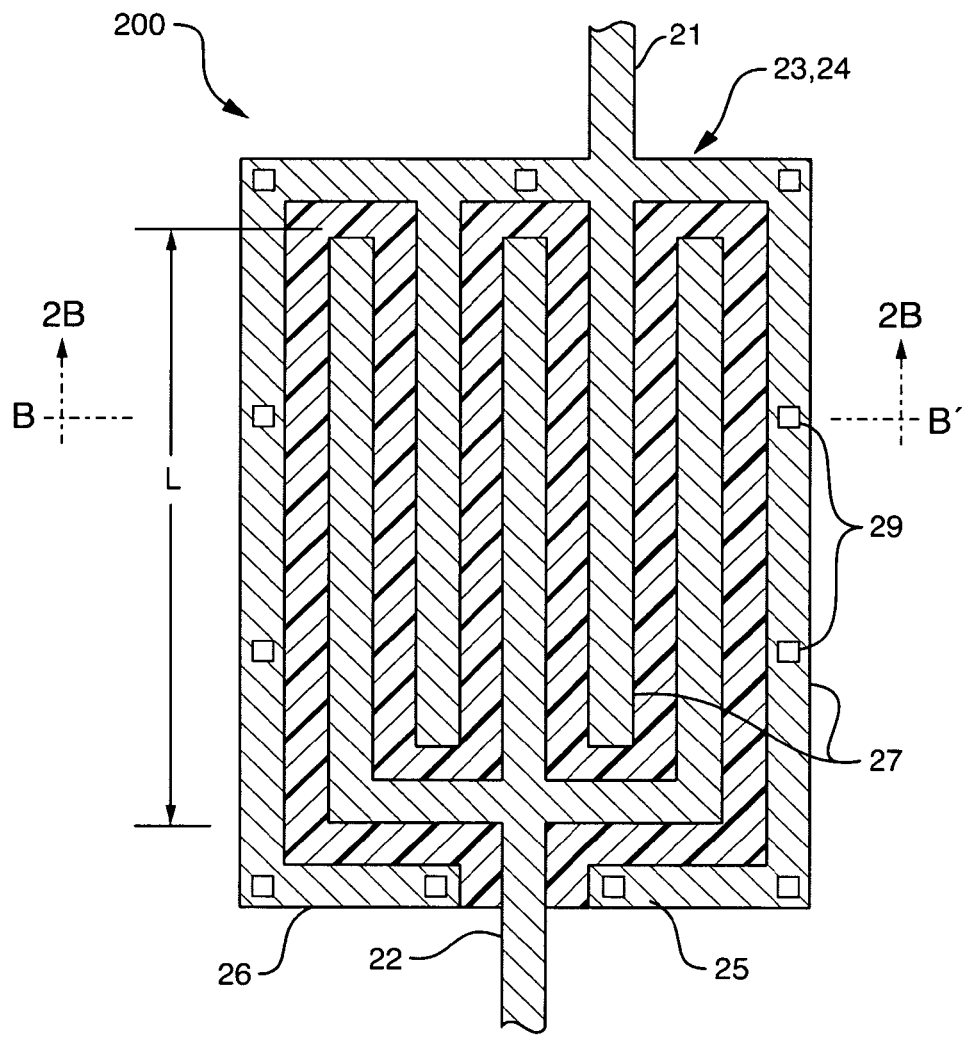
FIG. 2A is a block diagram of a self-shielded interdigitated MIM capacitor according to an embodiment of the present invention.
Figure 2B:
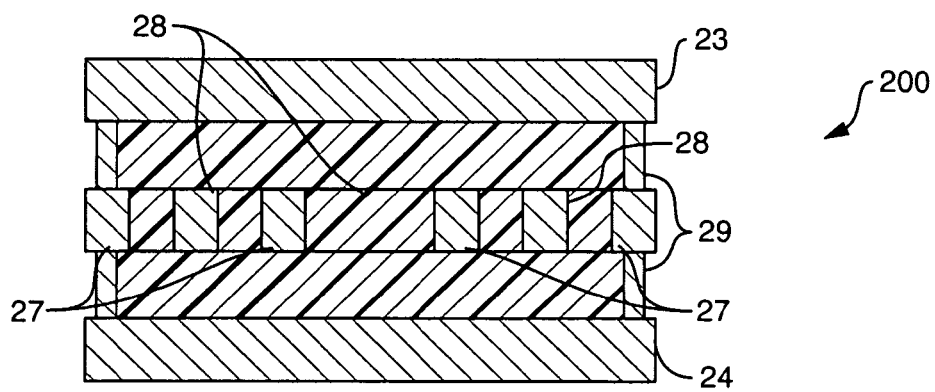
FIG. 2B is a cross-section diagram of the capacitor of FIG. 2A.

This embodiment is explained with the aid of FIGS. 2A and 2B. Consider first the interdigitated MIM capacitor 200 depicted in FIG. 2A. Here, first terminal 21 extends to a plurality of fingers 27, the outermost of which are extended and wrapped around the lower corners of second terminal 22; these extensions are identified as 25 and 26 in FIG. 2A. Further, two additional layers of metal are used to form plates 23 and 24, covering the hatched area in FIG. 2A. The cross-section along B-B' in FIG. 2B shows these two new metal plates 23, 24 more clearly. They are electrically connected to terminal 21 by vias, such as vias 29, either inside or outside the area shown.

The effect of these new features is that terminal 21 surrounds terminal 22, including fingers 28, almost completely in both horizontal and vertical directions. Plates 23 and 24 provide shielding in the vertical direction, and the outer fingers and other elements of terminal 21 provide horizontal shielding. Thus terminal 22 is provided with nearly-complete shielding from both ground and other circuit nodes: terminal 22 has capacitance almost entirely to terminal 21, and almost no capacitance to any other circuit node. Only the external terminal 22 connection (extending downward beyond the main rectangular capacitor area in FIG. 2A) is un-shielded. This shielding of one capacitor plate (22) by the other (21) is here termed 'self-shielding.' In many applications, only one capacitor plate needs to have good shielding and low parasitic capacitance: the self-shielding design of FIGS. 2A and 2B satisfies these requirements.

Figure 1A:
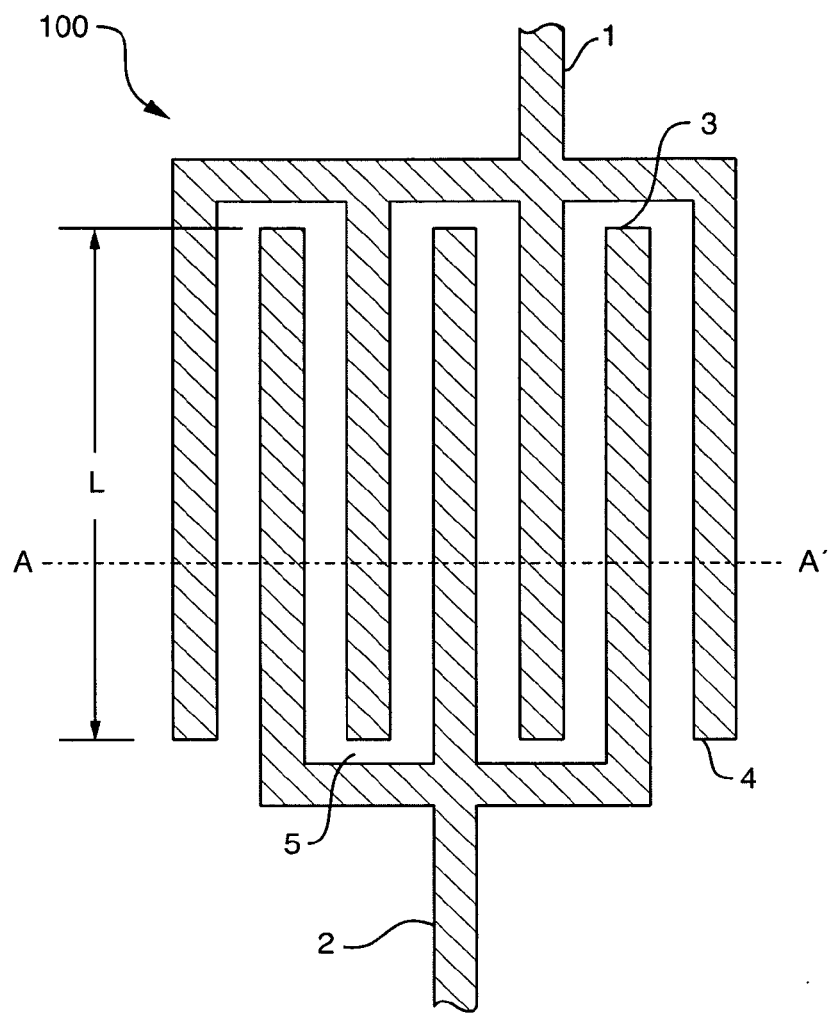
FIG. 1A is a block diagram of a prior art interdigitated MIM capacitor.
Figure 1B:
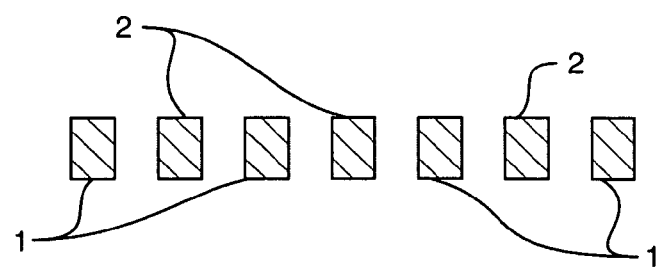
FIG. 1B is a cross-section diagram of the prior art capacitor of FIG. 1A.

For a given area, the capacitor 200 of FIGS. 2A and 2B provides slightly higher capacitance than the capacitor 100 of FIGS. 1A and 1B, due to the added vertical-field contribution of plates 23 and 24 as well as the extended terminal-1 segments 25 and 26. However, the dependence of capacitance on design parameters $N_F$ and L, as expressed in Equation 2, remains valid. The three capacitance coefficients $C_0$, $C_1$ and $C_2$ have different values due to the revised geometry.

Figure 3A:
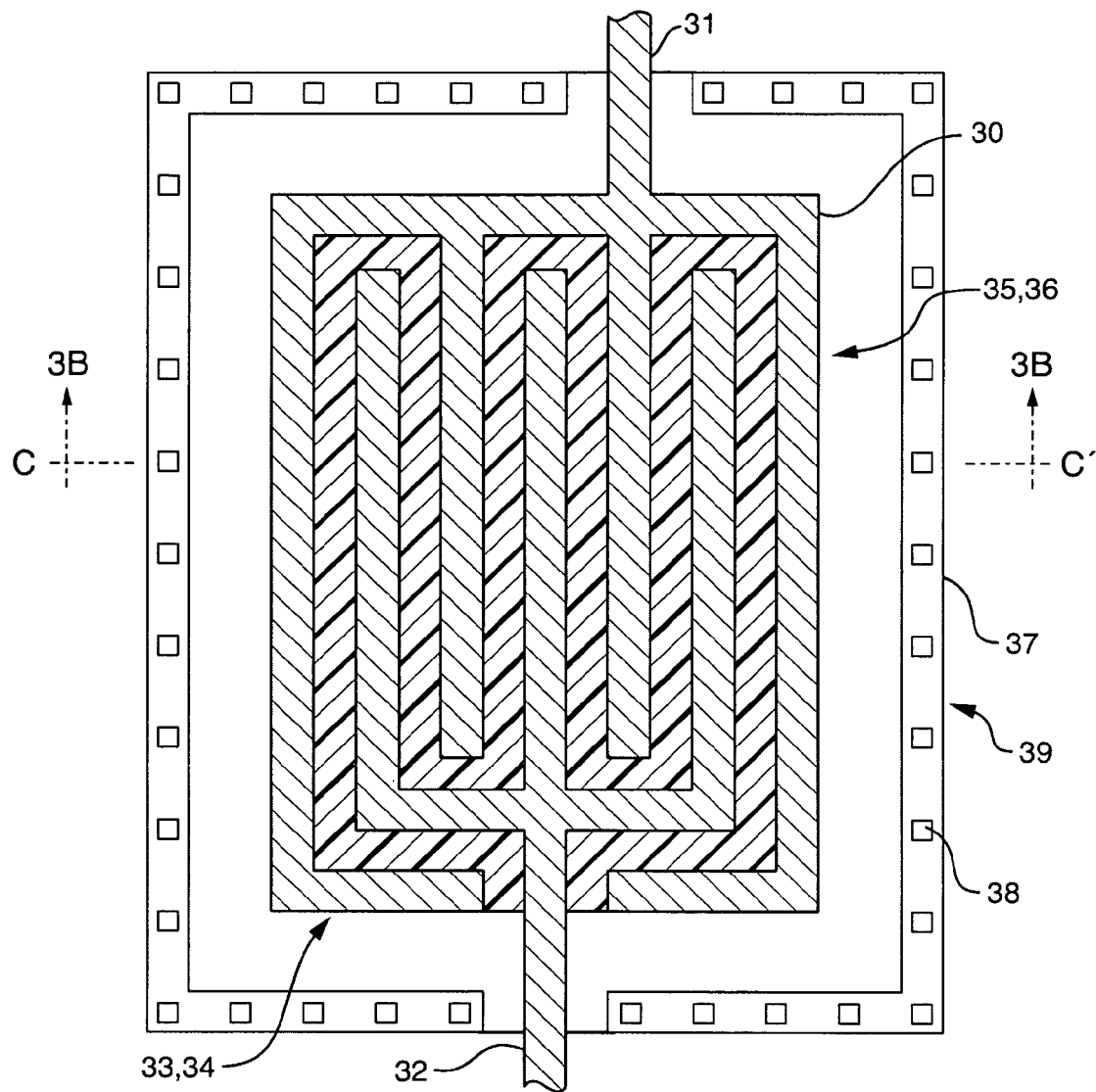
FIG. 3A is a block diagram of a self-shielded capacitor with additional shielding layers.
Figure 3B:
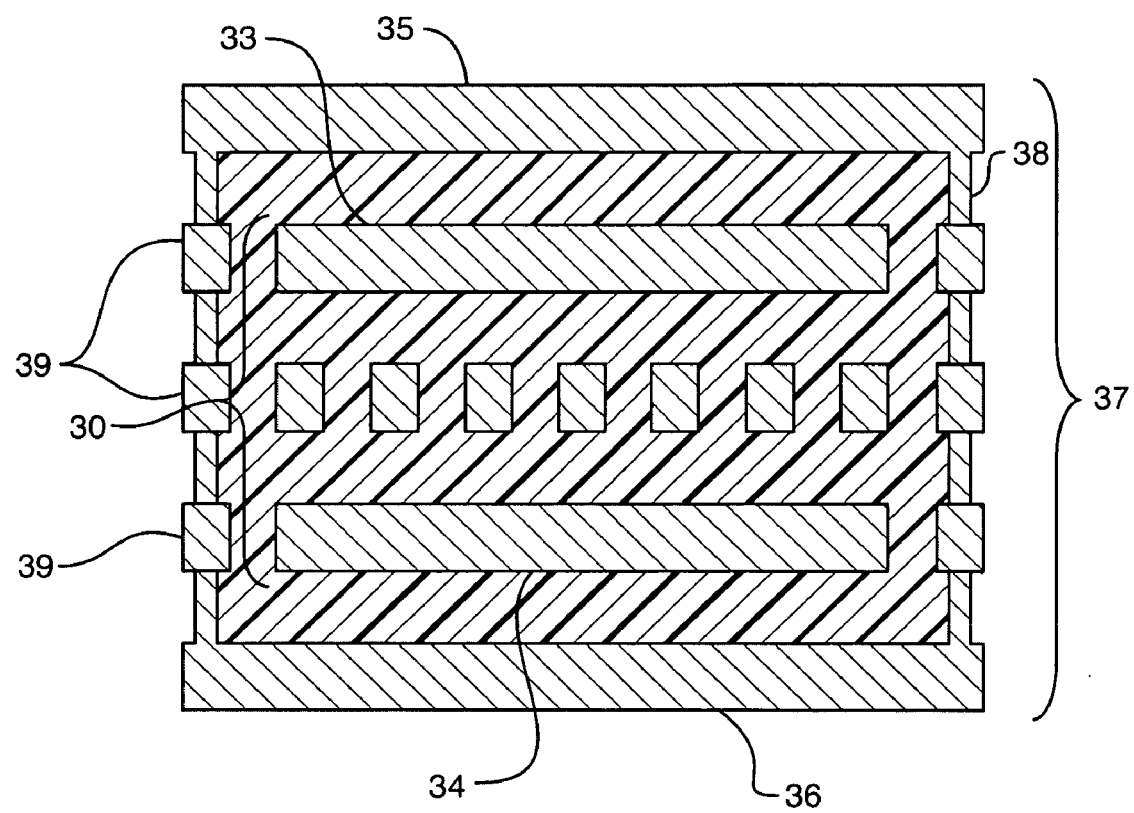
FIG. 3B is a cross-section of the capacitor of FIG. 3A.

For applications in which capacitor terminal 21 must also be shielded, two additional metal layers can be used, as shown in FIGS. 3A and 3B, to provide the needed shielding. In FIG. 3A, the entirety of FIG. 2A is repeated as capacitor 30. Terminals 31 and 32, corresponding to 21 and 22, and plates 33 and 34, corresponding to 23 and 24, are identified. Capacitor 30 is surrounded by a shield 'wall' 37, and covered top and bottom by shield plates 35 and 36. A cross section along line C-C', as shown in FIG. 3B, shows the structure of the 'wall' 37 and shield plates 35 and 36 relative to the capacitor 30. The vertical 'wall' 37 is constructed of metal lines 39 in the three metal layers used by capacitor 30, plus rows of vias such as 38 connecting these lines and the top and bottom plates 35 and 36. This wall is penetrated by only one metal layer, carrying the connections to terminals 31 and 32 which are visible in FIG. 3A.

As an alternative to the use of a metal layer as shown in FIG. 3B (which may be needed for interconnect purposes) the bottom shield plate 36 can be implemented with a polysilicon or diffusion layer. The minimum number of metal layers required to implement the fully-shielded capacitor of FIGS. 3A and 3B is thus four.

Walls 37 and plates 35 and 36 provide effective shielding of terminal 31 from external circuit nodes. As a side effect, however, they add parasitic capacitance from terminal 31, and also a slight parasitic capacitance from terminal 32, to the shield, which is usually at ground potential. In contrast, the shielding of terminal 22 in FIGS. 2A and 2B is provided by terminal 21 itself (self-shielding) and adds no parasitic capacitance to terminal 22. Thus the added shielding for terminal 31 represents a compromise.

Figure 4:
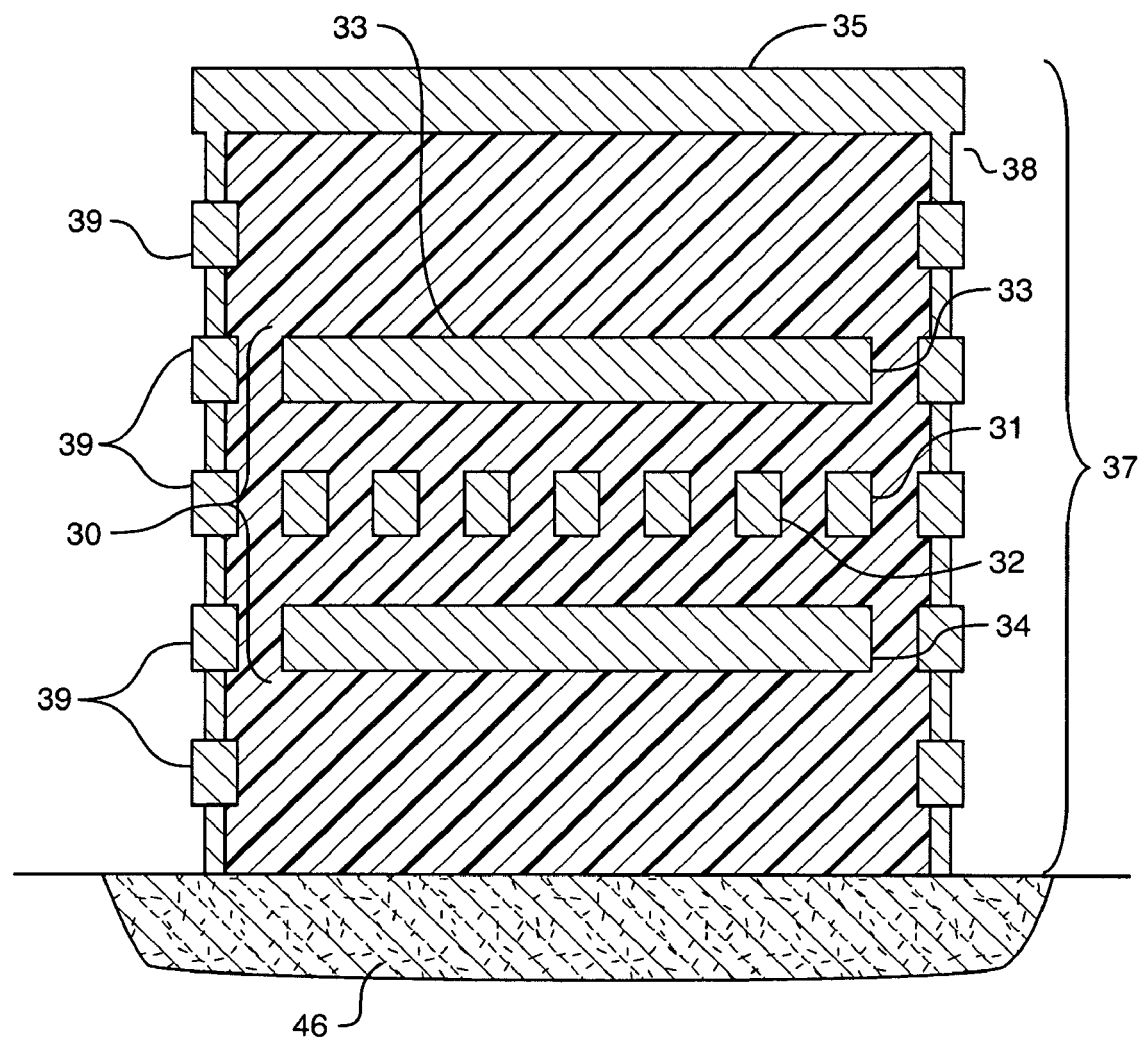
FIG. 4 is a cross-section of a capacitor with increased spacing to the additional shielding layers.

If additional metal layers, together with their inter-metal dielectric layers, are available, this added parasitic capacitance can be reduced. FIG. 4 shows a cross section (analogous to FIG. 3B) of such a structure. The use, mentioned above, of a diffused layer for the bottom shield plate 46 is also illustrated in FIG. 4. As many metal layers as are available may be used in this way to minimize parasitic capacitance.

The self-shielded capacitors of FIGS. 2, 3, and 4 all have an 'inner' terminal (such as 22) and an 'outer' terminal (such as 21). These capacitors are inherently asymmetrical: the inner terminal is fully shielded by the outer terminal and has negligible parasitic capacitance; the outer terminal is either unshielded or may have explicit added shielding, which adds parasitic capacitance. In many applications this asymmetry is tolerable, and the near-zero-parasitic capacitance and near-perfect shielding of the inner terminal is valuable.

The other desirable property identified above was the provision of small-value capacitors with accurate matching and precise ratios. The improved interdigitated MIM capacitors of this invention can provide these features, as will be shown below.

Considering again Equation 2, the first term ($N_F L C_0$) provides ideal ratio capability. Capacitance depends linearly on the number of fingers $N_F$, a discrete parameter, and on the finger length L, a continuous one. Thus if the other terms in Equation 2 were negligible, arbitrary capacitance ratios could be precisely realized, with minimum capacitance limited only by the process design rules. If only the last ($C_2$) term in Equation 2 were negligible, then capacitors with accurate integer ratios could be realized by varying $N_F$ while keeping L constant. This capability is valuable in many applications, such as A/D converters where integer capacitance ratios are commonly used.

Figure 5:
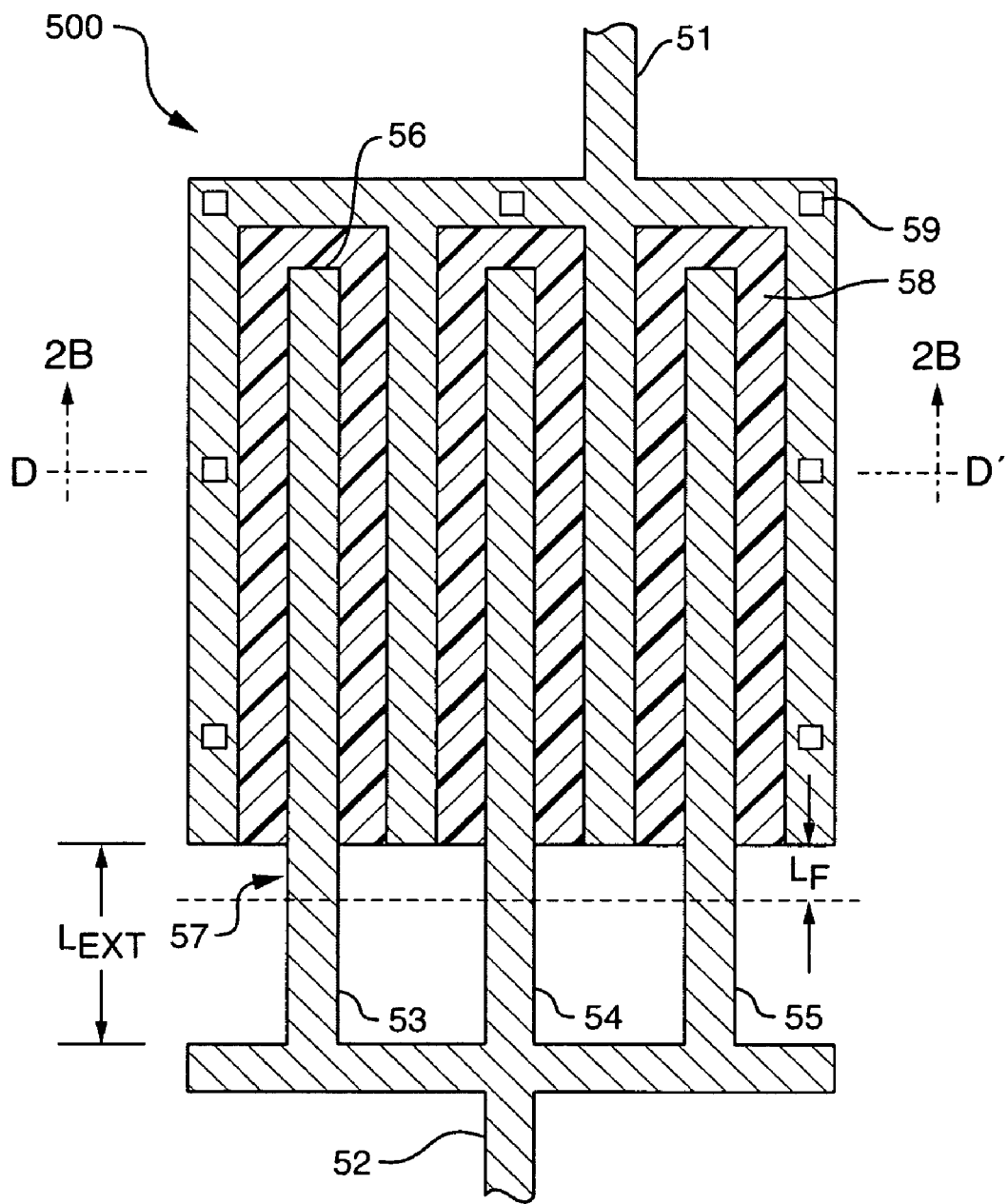
FIG. 5 is a block diagram of a capacitor with extended fingers.
Figure 6:
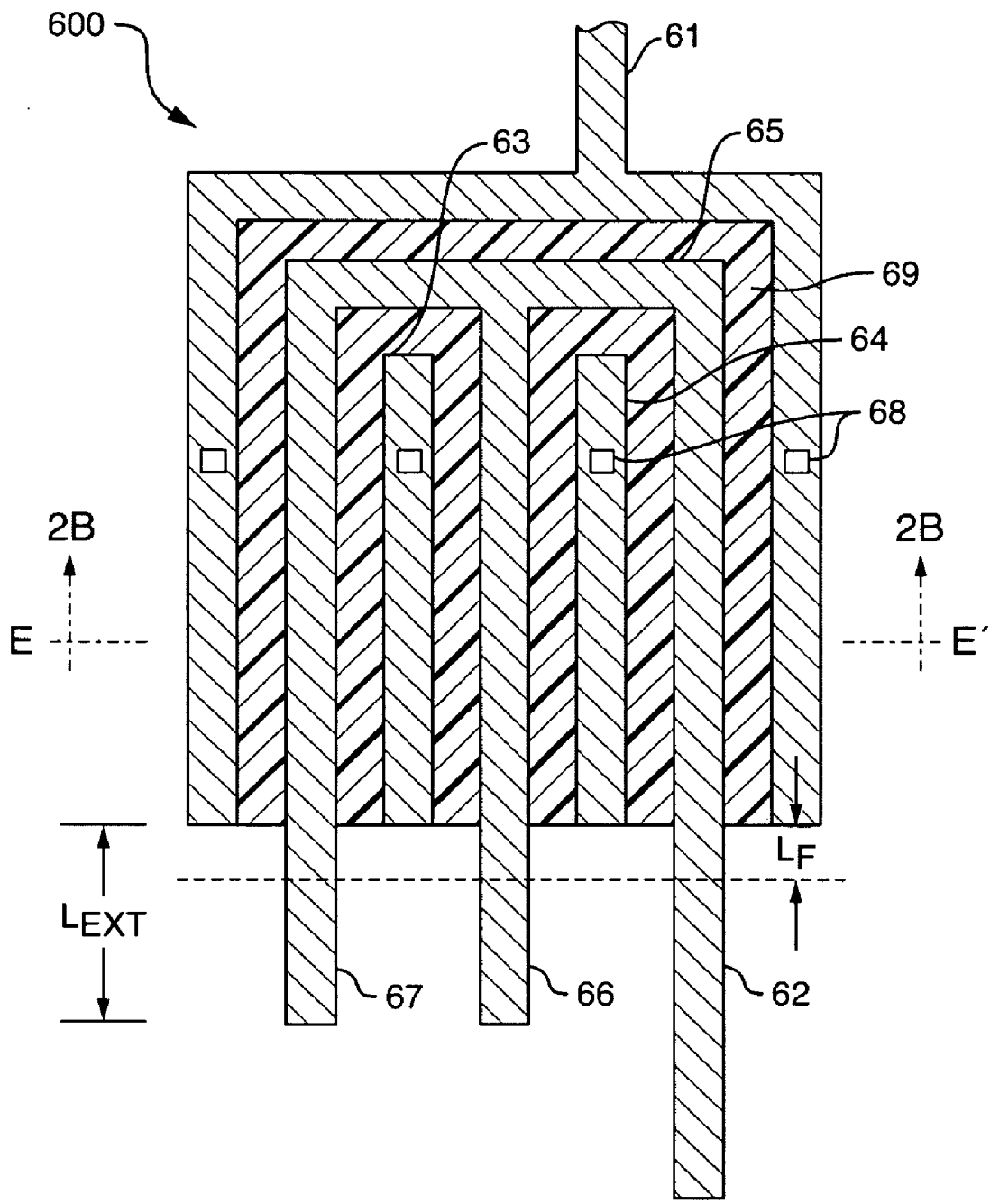
FIG. 6 is a block diagram of a capacitor with extended fingers.

In practice, this second condition ($C_2$ negligible) can be very nearly met for a set of MIM capacitor structures approximating the self-shielded design of FIG. 2A. Examples are shown in FIGS. 5 and 6. Note that the additional shielding shown in FIGS. 3 and 4 is omitted from FIGS. 5 and 6 for reasons of clarity, although it can be added to these structures if the extra shielding is needed.

FIG. 5 depicts a capacitor 500 similar to that of FIG. 2A, with $N_F=3$. A cross-section along D-D' is identical with that shown in FIG. 2B. However, the wrap-around extensions of the outer terminal-21 fingers (25 and 26 in FIG. 2A) are omitted from the capacitor 500 in this embodiment. The top and bottom plates 58 end co-incidentally with the ends of the terminal-51 fingers, as indicated by the hatched area. The three fingers, 53, 54, and 55, of terminal 52 are extended by a length $L_{EXT}$ beyond the ends of the terminal-51 fingers. $L_{EXT}$ is chosen to be greater than the length $L_F$, which represents the maximum significant fringing of electric field beyond the end of the terminal-51 fingers and top and bottom plates.

In this capacitor 500, each finger has an 'internal' end like 56 and an 'external' end like 57. The capacitance contributed by these finger-ends is nearly identical for each finger, because the geometry of each finger is identical and because the terminal-52 fingers extend beyond $L_F$. Since, in the derivation of Equation 2, $C_2$ arose from finger-end effects which were not equal for all fingers, it can be seen that $C_2$ for the design of FIG. 5 is negligible. In other words, for this design the capacitance has the form:

$$C = N_F L C_0 + N_F C_1 \quad \text{(Equation 3)}$$

This capacitance has the desirable property, described above, of being proportional to $N_F$ with no offset. Thus capacitors as shown in FIG. 5 can be used to realize accurate integer ratios of capacitance among multiple capacitors.

This structure has less-complete self-shielding than that of FIG. 2, due to the terminal-52 finger extensions and the lack of terminal-51 wrap-around segments like 25 and 26 in FIG. 2A. For values of L significantly greater than minimum metal dimensions, however, these are relatively minor effects, and may in many applications be rendered innocuous by additional shielding (like that shown in FIGS. 3 and 4) or careful placement of surrounding circuitry.

FIG. 6 depicts another capacitor 600 with similar properties. Again, the layout is similar to that of FIG. 2A, and the cross-section E-E' may be identical to that in FIG. 2B. The wrap-around extensions of terminal-21 fingers in FIG. 2A are omitted in FIG. 6, and the top and bottom plates 69 end co-incidentally with the ends of the terminal-61 fingers. As with FIG. 5, terminal-62 fingers 62, 66, and 67 extend by $L_{EXT}$ beyond the terminal-61 fingers, with $L_{EXT} > L_F$. In contrast to FIG. 5, the connection between the fingers of terminal 62 is made at the top of this capacitor by metal line 65. Also fingers 63 and 64, the inner fingers of terminal 61, are connected by vias such as 68 to the top and bottom plates, which are in turn connected to terminal 61. Outer terminal-61 fingers are likewise supplied with vias, in order to assure matched capacitance per finger.

Although the geometry of the outer fingers of terminal 62 differs from that of the inner ones, the terminal-62 finger-end capacitances in FIG. 6 are nearly identical. Consequently, as with FIG. 5, the total capacitance between terminals 61 and 62 obeys Equation 3 to a very good approximation, thus providing accurate capacitance proportionality to $N_F$. This structure also has less-perfect self-shielding than that of FIG. 2. As with the FIG. 5 capacitor, if L is significantly greater than minimum metal dimensions, then the shielding loss is minor, and may be rendered innocuous by similar means.

As with the capacitor designs of FIGS. 2, 3, and 4, those of FIGS. 5 and 6 (and of FIGS. 7, 8, and 9 below) can be generalized to any number of fingers.

Figure 7A:
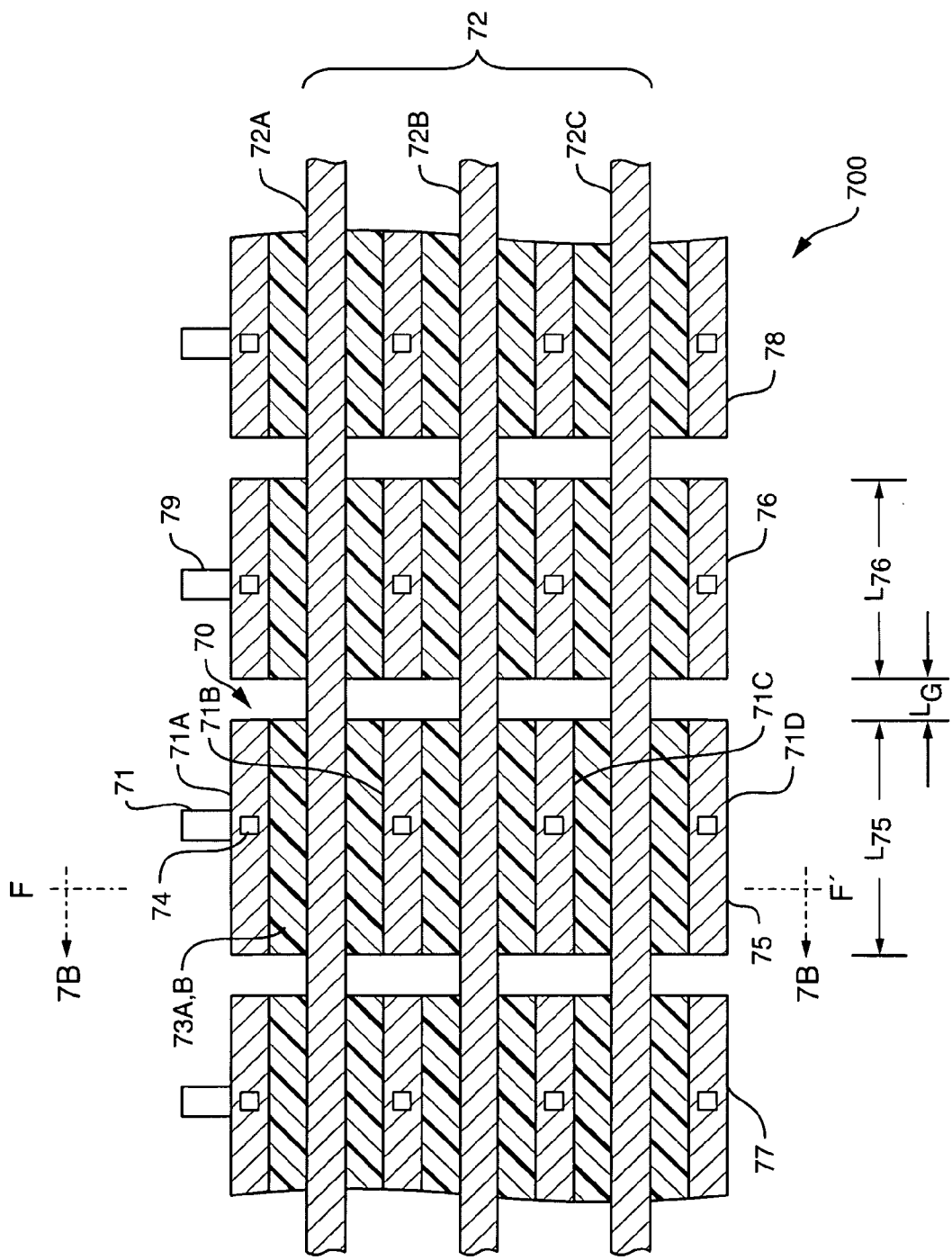
FIG. 7A is a block diagram of a capacitor array with common inner-terminal fingers.
Figure 7B:
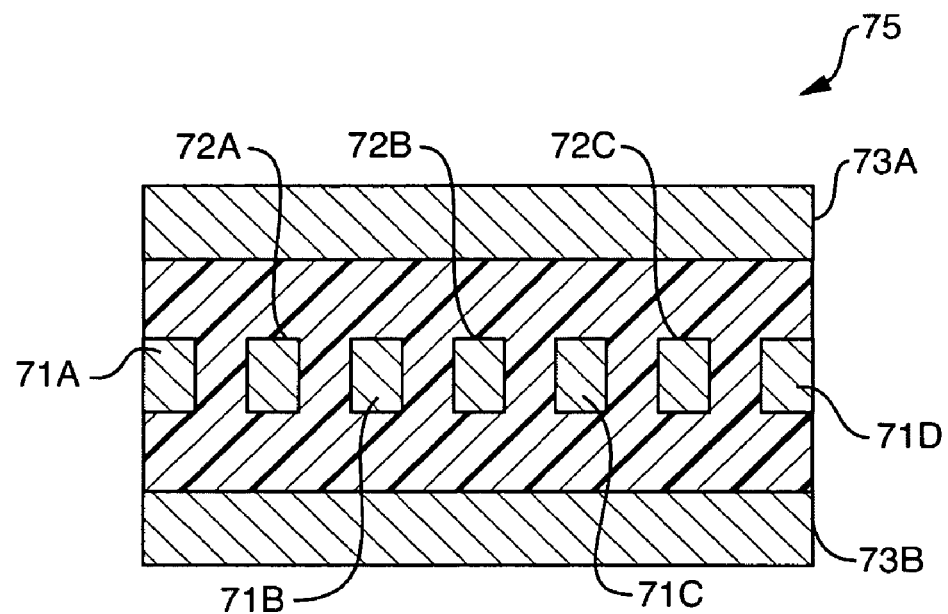
FIG. 7B is a cross-section of a capacitor in the array of FIG. 7A.
Figure 7C:
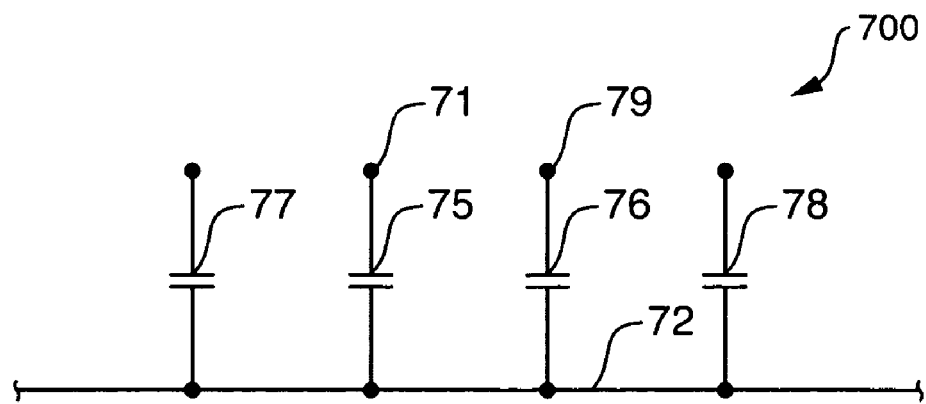
FIG. 7C is an electrical schematic diagram of the capacitor array of FIG. 7A.

In many applications, multiple capacitors with a common terminal are required. When some but not all of such capacitors must have good matching or accurate ratios, the concepts embodied in FIGS. 2 through 6 can be applied to satisfy these requirements while also providing self-shielding. FIG. 7A through 7C show the essential concepts of a multiple-capacitor array exhibiting this combination of features. Certain details are explained below with the aid of FIGS. 8 and 9.

FIG. 7A shows an array 700 of four capacitors in plan view: capacitors 75 and 76 are shown completely, while capacitors 77 and 78 are partially shown. The array 700 can be extended with additional capacitors, as discussed below. Terminal 72 is common to all four capacitors 75-77. It is made up of three fingers 72A through 72C, which extend through all four capacitors and may continue as indicated. The connection between the three fingers constituting terminal 72 is not shown in this figure, but is discussed below. FIG. 7C shows a schematic circuit diagram of the structure of the array 700.

Capacitor 75 is representative of this design. A section F-F' through it is shown in FIG. 7B: it can be seen that this section may be identical to that of FIG. 2B. Fingers 71A through 71D and top and bottom-plates 73A, 73B are connected to terminal 71 of this capacitor by vias 74, while fingers 72A through 72C constitute terminal 72. Terminal 71 is the outer terminal, and terminal 72 is the inner terminal, which is surrounded by terminal 71 and consequently well-shielded and with very low parasitic capacitance, like terminal 21 of FIG. 2. The length of capacitor 75 along its fingers is $L_{75}$, and it has $N_F=3$ fingers. Capacitor 76 is identical in section to capacitor 75; it also has $N_F=3$, and has length $L_{76}$.

Capacitors 75 and 76 (and all other capacitors in this array 700) are separated by a gap of length $L_G$. The fingers of inner terminal 72 continue through these gaps, but all outer-terminal metal is interrupted. The electric field between inner and outer terminals fringes into the gaps, causing an increase $\Delta L_F$ in effective electrical length beyond the physical lengths $L_{75}$, $L_{76}$ etc. $\Delta L_F$ is a characteristic of the process and of the finger width, finger spacing and gap length used in the capacitor layout. $L_G$ is optimally the minimum metal spacing permitted in the process used to fabricate the capacitors. With finger spacing and $L_G$ both equal to the minimum permitted by the process, $\Delta L_F$ is approximately equal to $L_G$, and is well matched between different capacitors in the same circuit and independent of L and $N_F$.

FIGS. 7IB, 7IC, and 7ID of the outer terminal of capacitor 75 are connected to terminal 71 by vias, as indicated. With an identical via added to finger 71A, the small capacitance added by the vias is the same for each finger. This added capacitance can be regarded as a slight further increase $\Delta Lv$ in effective electrical length of the fingers.

The combined effects of field-fringing in the gaps and the vias can be expressed as:

$$L_{EFF}=L+\Delta L_F+\Delta L_V \quad \text{(Equation 4)}$$

where $L_{EFF}$ is the effective electrical length of a capacitor of physical length L.

It can be seen that, with the effective length accounted for, capacitors 75 and 76 do not have any end effects of the types discussed above. Each terminal-72 finger continues from capacitor to capacitor with no irregularities. With no end effects, the capacitance of each such capacitor is given by:

$$C=N_F L_{EFF} C_0 \quad \text{(Equation 5)}$$

Capacitors of this type can be designed for precise discrete capacitance ratios by selecting $N_F$. Capacitance per finger is selected by choosing L. Because $\Delta L$ is quite consistent for a given fabrication process, reliable ratio accuracy can also be obtained by employing different L values. This parameter, being continuous rather than discrete, allows non-integer capacitance ratios.

With $\Delta L$ on the order of the minimum metal spacing, this design can provide extremely small capacitor values with good matching and ratios. As an example, in a typical CMOS process of the 0.18-micrometer generation, ratio accuracy of 1% can typically be obtained with capacitors as small as 5 femto Farads (fF).

With the capacitor-array design of FIG. 7, the gaps such as 70 slightly reduce the completeness of self-shielding of terminal 72 by outer terminals 71, 79, etc. However, because metal thickness in typical processes is greater than $L_G$, this effect is very minor. An added shield like those discussed in connection with FIGS. 3 and 4, or even a partial shield of similar design covering only the gaps, can eliminate coupling from external signals while adding only negligible parasitic capacitance to terminal 72.

Thus the capacitor-array design of FIG. 7 provides both the matching and ratio accuracy and the self-shielding benefits sought. As mentioned above, this design can be generalized to include one, two, or more capacitors providing these benefits. Multiple capacitor arrays similar to FIG. 7 but with differing numbers of fingers can be employed to provide groups of capacitors with precise discrete ratios.

Terminating an array of capacitors like that shown in FIG. 7A requires a different design for the end units. Connecting the separate fingers of inner terminal 72 likewise requires a distinct design. These two special requirements dictate less-ideal characteristics for these unique capacitors, involving either finger-end effects which yield a capacitance obeying Equation 2 or 3 (rather than the more-ideal Equation 5), or reduced self-shielding completeness, or both effects. Nevertheless, in many practical designs such less-ideal capacitors can be combined with a set of very well-matched capacitors such as 75 and 76 to perform useful functions with negligible compromise.

FIGS. 8A, 8B, and 9A-9C depict capacitors suitable for terminating a capacitor array like that of FIG. 7. As with the capacitors described above, the number of fingers shown is merely illustrative, and $N_F$ can range from 1 to any number required.

Figure 8A:
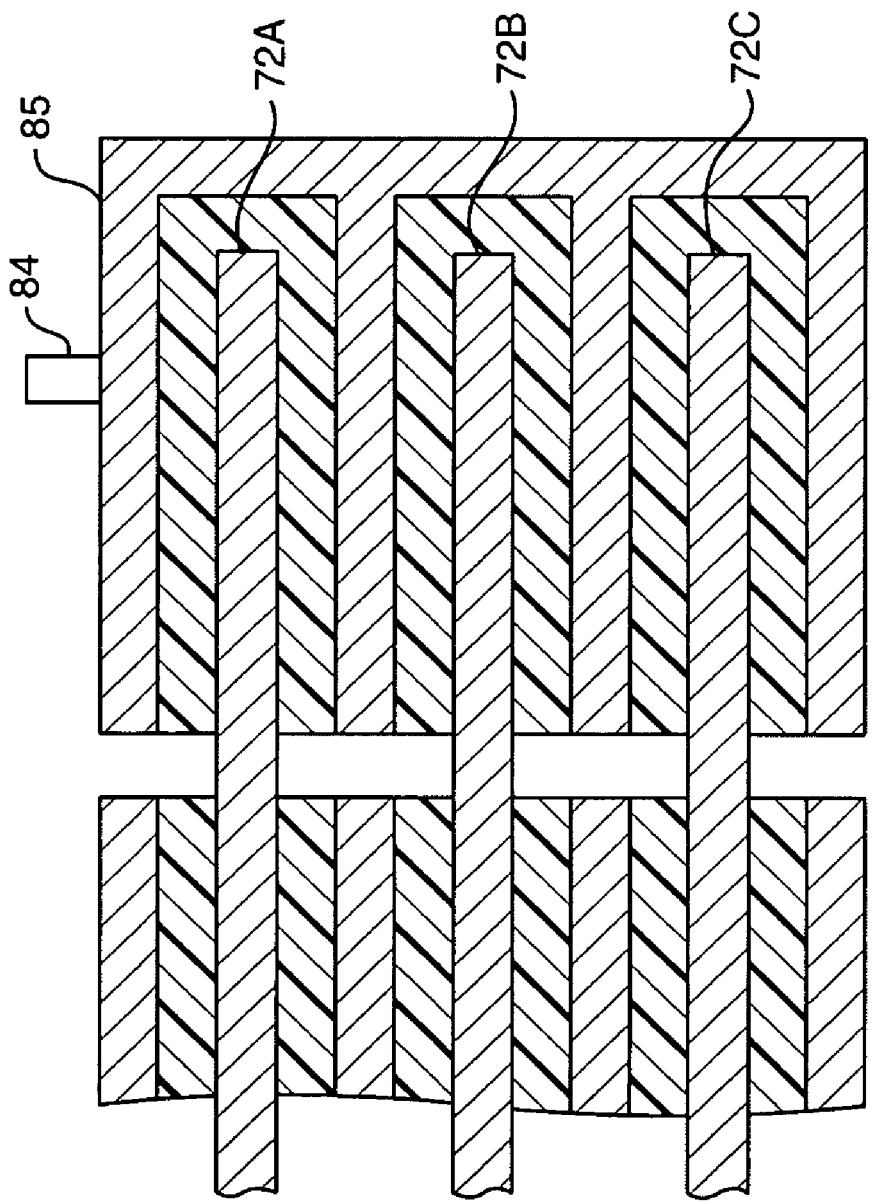
FIG. 8A is a block diagram of an array terminating capacitor with terminated fingers at one end of a capacitor array.
Figure 8B:
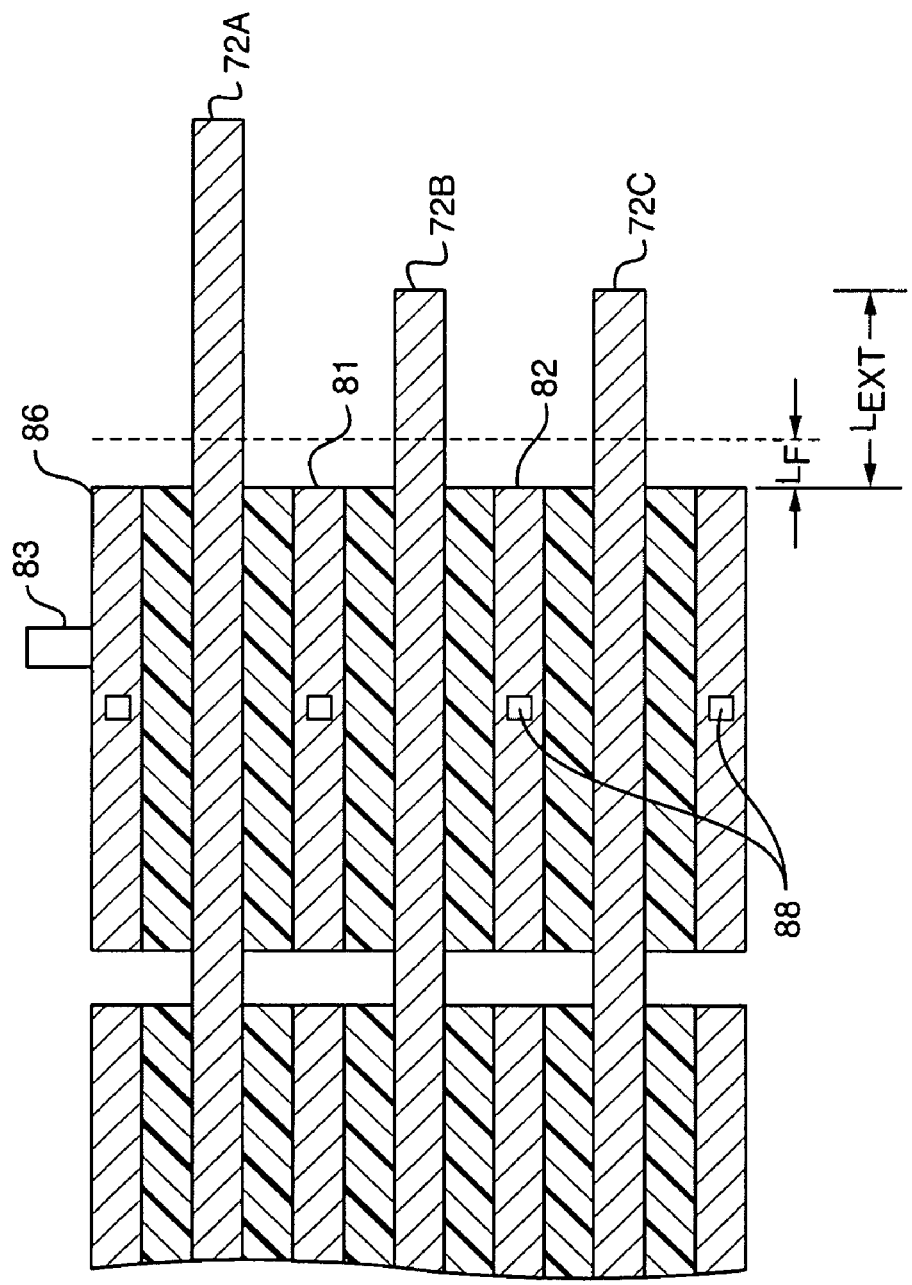
FIG. 8B is a block diagram of an array terminating capacitor with extended fingers at one end of a capacitor array.

FIGS. 8A and 8B show examples of capacitor designs which terminate an array like that of FIG. 7A without connecting the inner-terminal fingers. FIG. 8A shows a termination-capacitor design where terminal 84 extends to a number of fingers 85 that surround each of the fingers 72A-C of common terminal 72. This design provides complete self-shielding together with precise proportionality to $N_F$ (i.e., the capacitance obeys Equation 3). This capacitor is similar to the upper end of the capacitor in FIG. 2A.

FIG. 8B shows a termination-capacitor design which sacrifices some self-shielding effectiveness but allows for external connections to the inner-terminal fingers. The capacitor 86 is similar to the lower end of the capacitor in FIG. 6, and also obeys Equation 3. The indicated vias 88 are necessary to connect the isolated outer-terminal fingers such as 81 and 82 to outer terminal 83, as discussed in connection with FIG. 7A. These vias add a small capacitance between inner and outer fingers which is equal for each inner-terminal finger, thus maintaining C proportional to $N_F$.

Figure 9A:
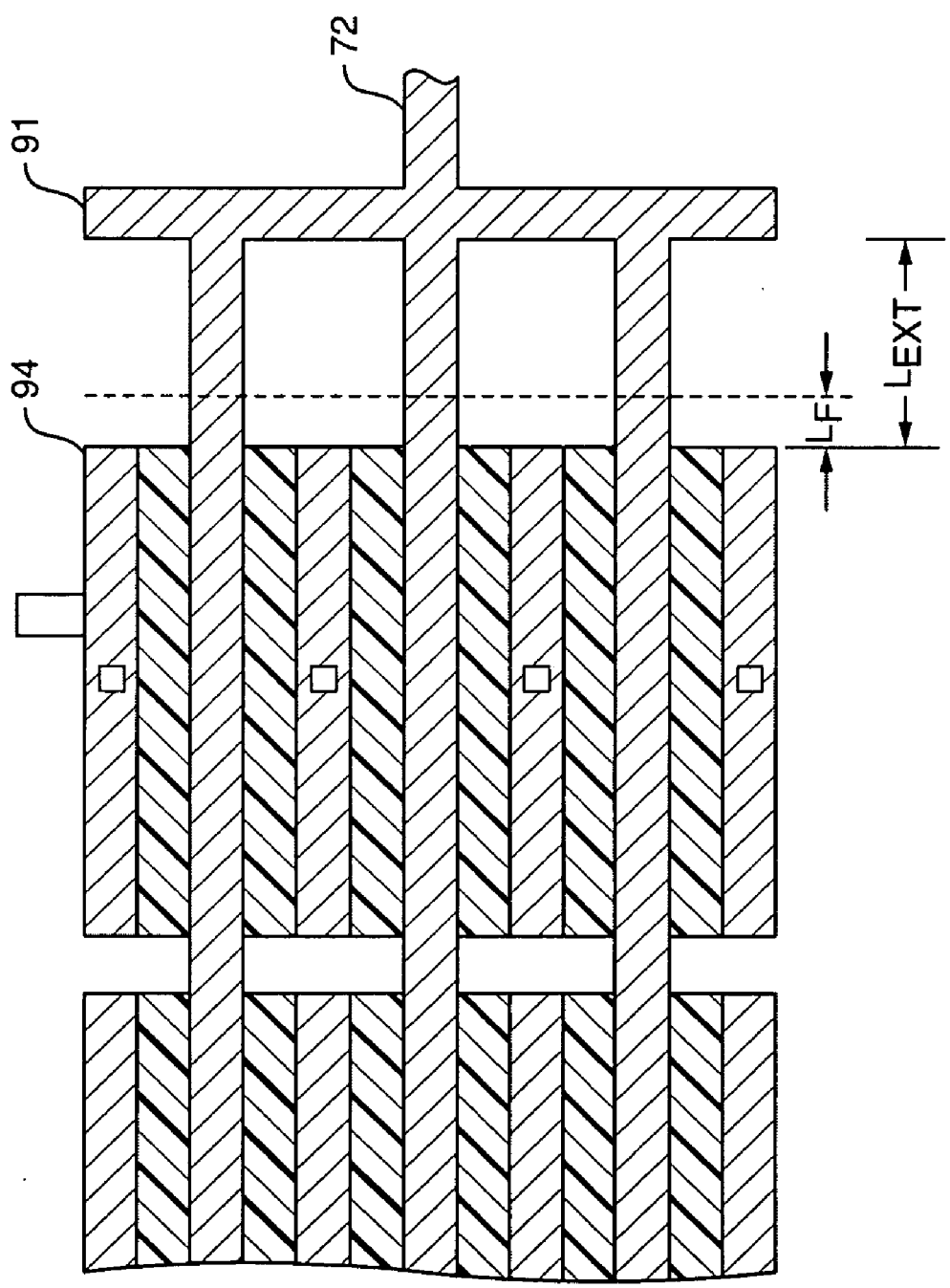
FIG. 9A is a block diagram of an array terminating capacitor with extended fingers at one end of a capacitor array, the extended fingers coupled to a common terminal.
Figure 9B:
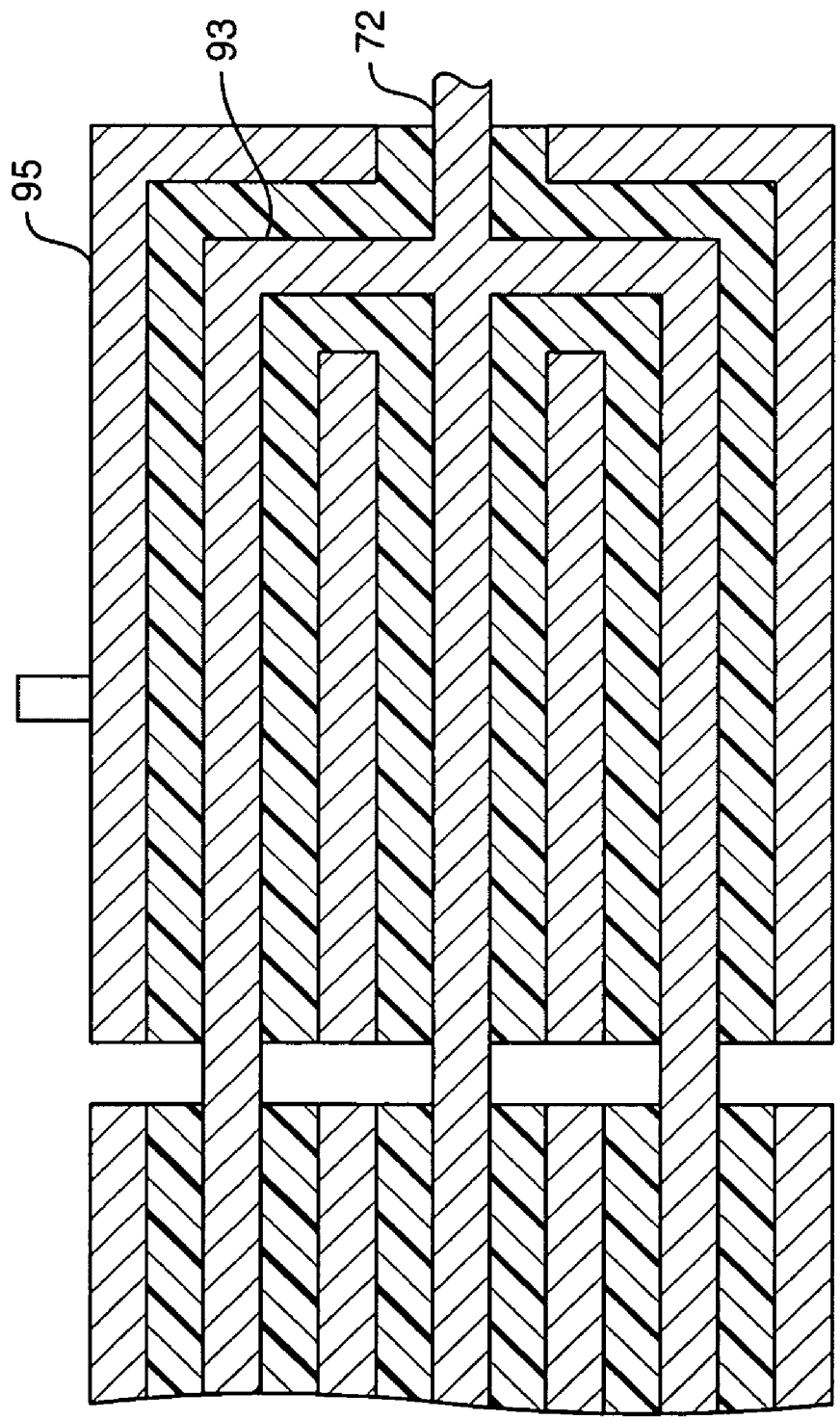
FIG. 9B is a block diagram of an array terminating capacitor at one end of a capacitor array, the capacitor having fingers coupled to a common terminal.
Figure 9C:
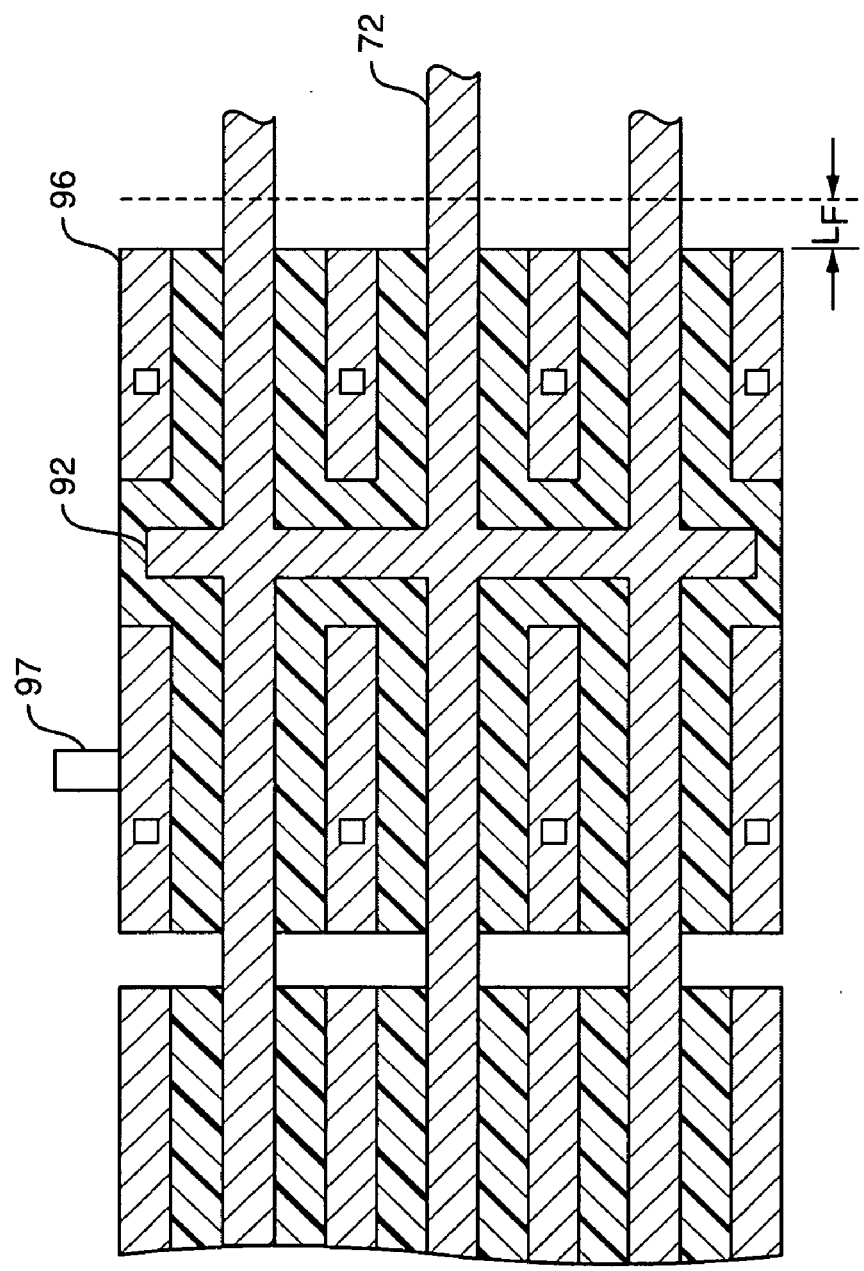
FIG. 9C is a block diagram of an array terminating capacitor at one end of a capacitor array, the capacitor having fingers connected via a secondary finger extending perpendicular to the fingers.

FIGS. 9A, 9B, and 9C show designs which serve both to terminate a capacitor array, such as the array 700 of FIG. 7A, and to provide connections between the inner-terminal fingers. FIG. 9A shows a capacitor 94 similar to the lower end of the capacitor in FIG. 5, with the inner fingers extending beyond $L_F$. Like that design, it obeys Equation 3, providing capacitance precisely proportional to $N_F$. Similarly, it sacrifices some self-shielding for the sake of $N_F$ proportionality: the extended regions of the inner-terminal fingers and the connection 91 between them are not shielded by the outer terminal. Like the capacitor of FIG. 8B, the capacitor of FIG. 9A includes vias for connection to isolated outer-terminal fingers, which add a small unit capacitance per inner-terminal finger.

FIG. 9B shows a termination-capacitor design which is similar to the lower end of the capacitor of FIG. 2A. Like that design, it provides near-perfect self-shielding. The capacitor 95 has a capacitance that obeys Equation 2, including a constant term $C_2$; thus for this design C is not directly proportional to $N_F$. This design includes a line 93 connecting the fingers of the common terminal 72, as well as vias like those described in connection with FIG. 8B for connecting isolated outer-terminal fingers.

FIG. 9C shows a termination-capacitor design which is similar in concept to the lower end of the capacitor of FIG. 6. The capacitor 96 obeys Equation 3, providing capacitance proportional to $N_F$, while also connecting the inner-terminal fingers. The connection 92 between the terminal 72 fingers, as well as the vias providing connections to isolated fingers of terminal 97, both contribute to the $C_1$ term in Equation 3 for the capacitor 96. Compared with the design of FIG. 9A, this capacitor provides the connection 92 between inner-terminal fingers within the self-shielded region, thus reducing unshielded parasitic capacitance. Because of the extension of inner-terminal fingers beyond $L_F$, however, the self-shielding of this design is less complete than that of the capacitor 95 of FIG. 9B.

While this invention has been particularly shown and described with references to preferred embodiments thereof, it will be understood by those skilled in the art that various changes in form and details may be made therein without departing from the scope of the invention encompassed by the appended claims.

What is claimed is:

1. An interdigitated Metal-Insulator-Metal capacitor, comprising:
a first terminal extending to a plurality of metal fingers formed in a first layer, two of the metal fingers being outermost of the fingers;
a second terminal extending to one or more metal fingers formed in the first layer and interspaced between the first terminal fingers; and
a plurality of metal plates occupying layers above and below the first layer, the metal plates extending to the first layer at least to the outermost metal fingers and connected to the outermost metal fingers.

2. The capacitor of claim 1, wherein the outermost metal fingers are coupled to secondary metal fingers, the outermost metal fingers and secondary metal fingers substantially surrounding the other of the metal fingers.

3. The capacitor of claim 1, further comprising shielding layers occupying layers above and below the plurality of metal plates and separated from the metal plates by at least one dielectric layer each above and below the plurality of metal plates, the shielding layers electrically isolated from the metal fingers.

4. The capacitor of claim 3, further comprising a series of stacked metal strips and vias connecting the shielding layers, the series and shielding layers forming a shield substantially encompassing the plurality of metal plates.

5. The capacitor of claim 3, wherein the shielding layers are separated from the plurality of metal plates by at least one dielectric layer each above and below the plurality of metal plates.

6. The capacitor of claim 3, wherein the shielding layers include metal plates.

7. The capacitor of claim 3, wherein one of the shielding layers includes a diffused region.

8. The capacitor of claim 1, wherein the second terminal extends beyond the plurality of metal fingers by a length exceeding a respective fringing-field extent, fingers of the second terminal being coupled together with the second terminal at a region exceeding the fringing-field extent.

9. The capacitor of claim 1, wherein the second terminal extends beyond the plurality of metal fingers by a length exceeding a fringing-field generated by the plurality of metal fingers, fingers of the second terminal being coupled together at a region between the plurality of metal plates.

10. An array of capacitors, comprising:
at least two capacitors, each capacitor comprising:
(i) a plurality of metal fingers formed in a first metal layer and coupled to a respective first terminal; and
(ii) a plurality of metal plates occupying layers above and below the first layer, the metal plates interspaced between and extending to the first layer at least to the outermost metal fingers and connected to the outermost metal fingers; and
a second terminal formed in the first metal layer and extending to at least one common metal finger between the plurality of metal fingers of each capacitor.

11. The array of claim 10, wherein the second terminal extends beyond the plurality of metal fingers of each of the capacitors by a length exceeding a fringing-field extent from the metal fingers, fingers of the second terminal being coupled together at a region exceeding the fringing-field extent.

12. The array of claim 10, wherein the second terminal includes a plurality of common metal fingers, the plurality of common metal fingers coupled together at a region between the plurality of metal plates of at least one of the plurality of capacitors.

13. The array of claim 12, wherein the at least one of the capacitors includes secondary metal fingers coupled to the outermost metal fingers, the outermost metal fingers and secondary metal fingers substantially surrounding the common metal fingers at three sides.

14. An interdigitated Metal-Insulator-Metal capacitor comprising:
a plurality of parallel metal fingers formed in a first layer and separated by a dielectric;
a first terminal coupled to a first subset of the plurality of parallel metal fingers, two of the first subset of the plurality of parallel metal fingers being outermost of the fingers;
a second terminal coupled to a second subset of the plurality of metal fingers, the second subset being interspaced between the first subset and electrically insulated from the first terminal by the dielectric; and
a plurality of metal plates occupying layers above and below the first layer, the metal plates extending to the first layer at least to the outermost metal fingers and connected to the outermost metal fingers.

* * * * *